(12) United States Patent
Jung

(10) Patent No.: US 10,165,680 B2
(45) Date of Patent: Dec. 25, 2018

(54) LIGHT-TRANSMITTING CONDUCTOR HAVING NANOSTRUCTURE PATTERN AND METHOD FOR MANUFACTURING SAME

(71) Applicant: INTREE CO., LTD, Gunpo-si, Gyeonggi-do (KR)

(72) Inventor: Kyung Ho Jung, Gyeonggi-do (KR)

(73) Assignee: INTREE CO., LTD, Gunpo-si (KR)

( * ) Notice: Subject to any disclaimer, the term of this patent is extended or adjusted under 35 U.S.C. 154(b) by 4 days.

(21) Appl. No.: 15/300,182

(22) PCT Filed: Oct. 31, 2014

(86) PCT No.: PCT/KR2014/010333
§ 371 (c)(1),
(2) Date: Sep. 28, 2016

(87) PCT Pub. No.: WO2015/156467
PCT Pub. Date: Oct. 15, 2015

(65) Prior Publication Data
US 2017/0150598 A1    May 25, 2017

(30) Foreign Application Priority Data

Apr. 9, 2014    (KR) .................. 10-2014-0042135

(51) Int. Cl.
*H05K 1/09*    (2006.01)
*H05K 3/10*    (2006.01)
(Continued)

(52) U.S. Cl.
CPC .......... *H05K 1/097* (2013.01); *H05K 1/0274* (2013.01); *H05K 3/06* (2013.01); *H05K 3/10* (2013.01); *H05K 3/4644* (2013.01); *H05K 2201/026* (2013.01); *H05K 2201/0302* (2013.01); *H05K 2203/0502* (2013.01)

(58) Field of Classification Search
CPC .......... H05K 1/09; H05K 1/092; H05K 1/095; H05K 1/097; H05K 3/101; H05K 3/102; H05K 3/108
See application file for complete search history.

(56) References Cited

U.S. PATENT DOCUMENTS

2015/0289366 A1* 10/2015 Frey .................. G06F 3/041
                                                                174/250

FOREIGN PATENT DOCUMENTS

CN    101689568 A    3/2010
CN    103649884 A    3/2014
(Continued)

OTHER PUBLICATIONS

International Search Report dated Oct. 15, 2015, issued in corresponding Application No. PCT/KR2014/010333.
(Continued)

*Primary Examiner* — Jeremy C Norris
(74) *Attorney, Agent, or Firm* — Stein IP, LLC

(57) ABSTRACT

The present invention provides a light-transmitting conductor comprising: a substrate; and a conduction layer on the substrate, wherein the conduction layer comprises a conductive material, and the conduction layer has a pattern corresponding to a network formed such that nanostructures are arranged to intersect with each other that includes a substrate and a conduction layer on the substrate.

28 Claims, 12 Drawing Sheets

(51) Int. Cl.
*H05K 1/02* (2006.01)
*H05K 3/46* (2006.01)
*H05K 3/06* (2006.01)

(56) References Cited

FOREIGN PATENT DOCUMENTS

| | | |
|---|---|---|
| JP | 2009-70660 A | 4/2009 |
| JP | 2012-174600 | 10/2009 |
| JP | 2011-65944 A | 3/2011 |
| JP | 2012-174600 A | 9/2012 |
| JP | 2013-73748 A | 4/2013 |
| KR | 10-2010-0017128 | 2/2010 |
| KR | 10-2010-0017128 A | 2/2010 |
| KR | 10-2014-0040919 | 4/2014 |
| KR | 10-2014-0040919 A | 4/2014 |
| WO | WO 2014/050440 A1 | 4/2014 |

OTHER PUBLICATIONS

Korea Office Action dated Jul. 8, 2015, issued to Korean Application No. 10-2014-0042135.
Chinese Office Action dated Mar. 16, 2017, issued to Chinese Application No. 201480077699.X.
Japanese Office Action dated Aug. 14, 2018, issued to Japanese Application No. 2016-559307.

\* cited by examiner

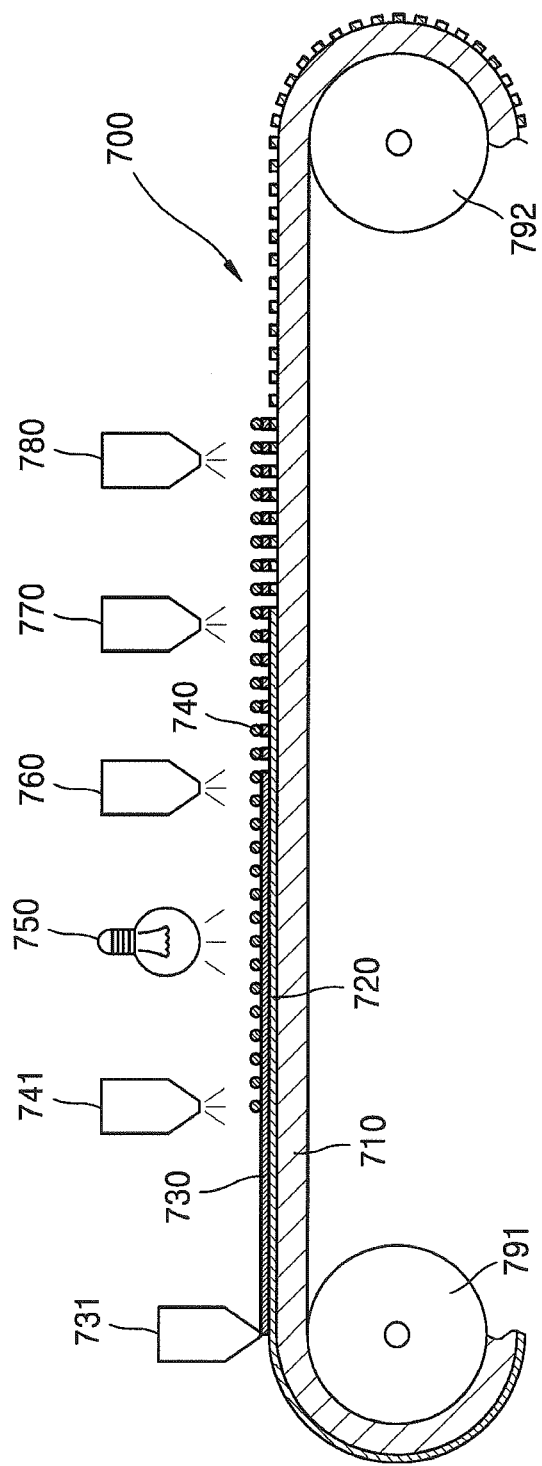

LIGHT-TRANSMITTING CONDUCTOR HAVING NANOSTRUCTURE PATTERN AND METHOD FOR MANUFACTURING SAME

CROSS-REFERENCE TO RELATED APPLICATIONS

This application claims is a national stage of International Application No. PCT/KR2014/010333, filed Oct. 31, 2014, which claims the benefit of priority to Republic of Korea Application No. 10-2014-0042135, filed Apr. 9, 2014, in the State Intellectual Property Office the disclosures of which are incorporated in their entireties herein by reference.

BACKGROUND OF THE INVENTION

1. Field of the Invention

The present disclosure is related to a light-transmitting conductor and a method of manufacturing the same, and more particularly, to a light-transmitting conductor comprising a pattern of a nanostructure and a method of manufacturing the light-transmitting conductor.

2. Description of the Related Art

TECHNICAL FIELD

The present disclosure is related to a light-transmitting conductor and a method of manufacturing the same, and more particularly, to a light-transmitting conductor comprising a pattern of a nanostructure and a method of manufacturing the light-transmitting conductor.

BACKGROUND ART

Light-transmitting conductors refer to electrically conductive thin conductor films that transmit light in the visible range and. The light-transmitting conductors are used in various electronic devices. For example, the light-transmitting conductors are widely used as transparent electrodes in flat display panels such as flat display TVs or desktop PCs, touch panels such as tablet PCs or smartphones, and electronic light-emitting devices. Two properties of the light-transmitting conductors, i.e., light transmission and conductivity, may be incompatible. That is, since the light-transmitting conductors have low conductivity if light transmission is high and vice versa, it may be difficult to have high light transmission and high conductivity at the same time.

Metal oxides such as indium tin oxide (ITO) have been widely used to simultaneously satisfy high light transmission and high conductivity. However, metal oxides tend to decrease light transmission as conductivity increases.

Light-transmitting conductors with metal mesh structures are also being used. However, in such light-transmitting conductors, line widths may not be set in detail and thus problems related to visibility may occur. Also, manufacturing processes are complicated, and moiré phenomenon may occur due to pattern structures.

Recently, carious researches are being conducted to form light-transmitting conductors using nanostructures such as carbon nanotubes or silver nanowires. However, such light-transmitting conductors may have low conductivity because individual nanostructures are connected while in contact.

Therefore, there is a need for developing light-transmitting conductors with excellent light transmission, conductivity, and high visibility, which may be easily manufactured and prevent moiré phenomenon.

DETAILED DESCRIPTION OF THE INVENTION

Technical Problem

The goal of the present invention is to provide a light-transmitting conductor comprising a pattern of a nanostructure and a method of manufacturing the light-transmitting conductor.

Technical Solution

According to claim 1, light-transmitting conductor includes a substrate; and a conduction layer on the substrate. The conduction layer includes a conductive material, and the conduction layer includes a pattern corresponding to a network formed by intersecting nano structures.

According to claim 2, a thickness of the conduction layer of claim 1 is substantially constant.

According to claim 3, the conduction layer of claim 1 is integrally formed.

According to claim 4, the conductive material of claim 1 includes metal.

According to claim 5, the conductive material of claim 1 is a conductive non-metal.

According to claim 6, the nanostructure of claim 1 is one selected from a group consisting of nanotube, nanowire, nano-fiber, and a combination thereof.

According to claim 7, the pattern of claim 1 includes a plurality of main portions corresponding to the nanostructures of the network, a plurality of intersections formed by intersecting the main portions, and an opening between the main portions.

According to claim 8, the main portions and the intersections of claim 1 are connected with the opening inside to form at least one closed system.

According to claim 9, the main portions and the intersections of claim 7 are connected without an evident distinction of inside and outside to form at least one open system.

According to claim 10, the opening of claim 7 has a protruding end of the main portion.

According to claim 11, when a thickness of the main portion of claim 7 is t, a width w of the main portion is within a range of 100 nm$\leq$w$\leq$5 t.

According to claim 12, a thickness t of the main portion of claim 11 is within a range of 0<t$\leq$500 nm.

According to claim 13, the intersection of claim 7 has substantially the same thickness as the main portion.

According to claim 14, the pattern of claim 1 is amorphous.

According to claim 15, a terminal layer that is electrically connected to the conduction layer of claim 1 is provided on the substrate corresponding to an outer periphery of the conduction layer.

According to claim 16, the terminal layer of claim 15 is formed with the same material as the conduction layer.

According to claim 17, the terminal layer of claim 15 has substantially the same thickness as the conduction layer.

According to claim 18, a method of manufacturing a light-transmitting conductor includes (1) coating a conductive material on a substrate; (2) coating a photosensitive material on a conductive material; (3) intersecting nanostructures on the photosensitive material to form a network of nanostructures; (4) shaping the photosensitive material according to the network of nanostructures on by using the network of nanostructures; and (5) forming a conduction layer by forming a pattern on the conductive material according to the shape of the photosensitive material.

According to claim 19, the conductive material of step (1) of claim 18 includes metal.

According to claim 20, the photosensitive material of step (2) of claim 18 is photosensitive polymer.

According to claim 21, the nanostructure of step (3) of claim 18 is one selected from a group consisting of nanotube, nanowire, nano-fiber, and a combination thereof.

According to claim 22, step (4) of claim 18 includes shaping the photosensitive material according to the network of nanostructures by exposing light on the photosensitive material through the network of nano structures.

According to claim 23, the pattern of step (5) of claim 18 is amorphous.

According to claim 24, the method further includes forming a terminal layer that is electrically connected with the conduction layer of claim 18, on the substrate corresponding to an outer periphery of the conduction layer.

According to claim 25, the forming of the terminal layer of claim 24 includes: coating the conductive material on the substrate; coating the photosensitive material on the conductive material; shaping the photosensitive material according to a shape of the mask by arranging a mask shaped with respect to the terminal layer on the photosensitive material and exposing light; and forming a pattern of the terminal layer on the conductive material according to the shape of the photosensitive material.

According to claim 26, a method of manufacturing a light-transmitting conductor includes: (1) coating a conductive material on a substrate; (2) patterning a terminal layer on the conductive material; (3) coating a photosensitive material on the conductive material such that a patterned portion of the terminal layer is included; (4) intersecting nanostructures on the photosensitive material except for a portion corresponding to the terminal layer, to form a network of nanostructures; (5) shaping the photosensitive material according to the network of nanostructures by using the network of nanostructures; and (6) forming a conduction layer connected to the terminal layer by forming a pattern of the conductive material except for the terminal layer according to the shape of the photosensitive material.

According to claim 27, the conductive material of step (1) of claim 26 includes an area where the conduction layer is formed and an area where the terminal layer is formed.

According to claim 28, the terminal layer of step (2) of claim 26 is patterned by photolithography.

Advantageous Effects of the Invention

The present invention may provide a light-transmitting conductor including a pattern of a nanostructure and a method of manufacturing the light-transmitting conductor.

DESCRIPTION OF THE DRAWINGS

FIG. 17 is a view for describing a method of manufacturing a light-transmitting conductor, according to an embodiment 7.

BEST MODE

Various embodiments of the invention will be described so that this disclosure is thorough and complete. The embodiments are exemplary, and merely provided to facilitate understanding of the inventive concept to those of ordinary skill in the art. As the embodiments allow various changes and modifications, the invention is not limited to the embodiments described below.

Embodiment 1

Figure 1:
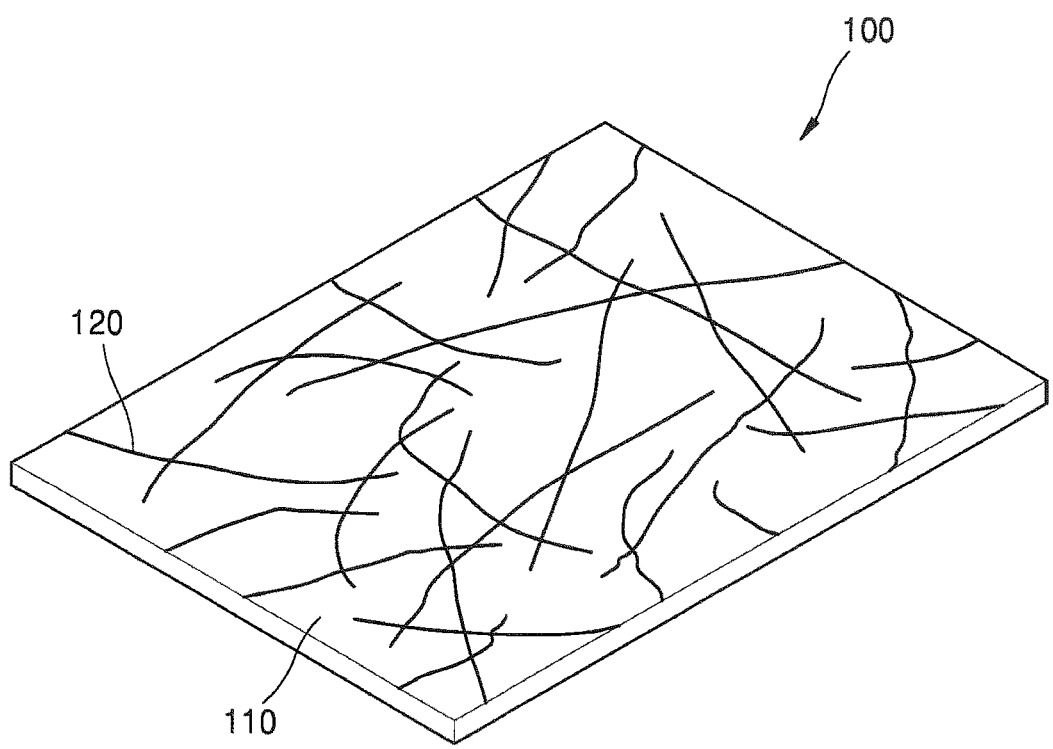
FIG. 1 is a schematic perspective view of a light-transmitting conductor, according to an embodiment 1.

According to the present embodiment, as shown in FIG. 1, a light-transmitting conductor 100 includes a substrate 110 and a conduction layer 120.

The light-transmitting conductor 100 may transmit light and be electrically conductive. In this case, it is preferable that light transmittance is at least 90%.

The conduction layer 120 is formed above the substrate 110 by coating or laminating. The substrate 110 may be rigid or flexible. The substrate 110 may be light-transmitting or non-light-transmitting. The substrate 110 may include a rigid material such as glass, polycarbonate, acryl, etc., or a flexible material such as polyester, polyolefin, polyvinyl, polyimide, silicon, etc. The substrate 110 may include cyclic olefin polymer (COP), cyclic olefin copolymer (COC), or triacetyl cellulose (TAC). However, the substrate 110 is not limited thereto.

The conduction layer 120 refers to an electric conduction layer fondled above the substrate 110. The conduction layer 120 may have an electric conductivity of $150\Omega/\square$ or less. Preferably, the conduction layer 120 may have an electric conductivity of $50\Omega/\square$ or less. The electric conductivity of the conduction layer 120 may be appropriately determined with regard to characteristics of conductive materials included in the conduction layer 120. The thickness of the conduction layer 120 may be substantially constant. Accordingly, the conduction layer 120 does not have an outwardly protruding portion, and thus, static electricity is hardly generated. Therefore, the conduction layer 120 is prevented from being damaged due to static electricity, and a separate coating layer is not necessary for static electricity prevention. For example, 100 nm to 300 nm is preferable for the thickness of the conduction layer 120. It is preferable for the thickness of the conduction layer 120 to be substantially constant. However, the conduction layer 120 is not limited thereto, and may have any thickness that is appropriate for forming a layer. The conduction layer 120 may be an integrally formed single unit, e.g., a copper single layer.

However, the conduction layer 120 is not limited to the integrally formed single unit, and may be formed as a plurality of layers, e.g., a three-layer structure including molybdenum-aluminum-molybdenum (Mo—Al—Mo).

The conduction layer 120 may include a conductive material. The conductive material of the conduction layer 120 may include metal such as copper, aluminum, silver, molybdenum, and nickel. However, the conductive material of the conduction layer 120 is not limited to metal, and may include any conductive material, such as a metal compound, e.g., conductive non-metal or silver halide. The conductive material may be formed on the substrate 110 by using various methods. For example, the conductive material may be formed on the substrate 110 through deposition, such as sputtering.

The conduction layer 120 includes a pattern that corresponds to a network that is formed by intersecting nanostructures. The nanostructure may include nanotubes, nanowires, nano-fiber, or a combination thereof. The nanostructure may include any material. For example, carbon nanotubes, silver nanowire, carbon nano-fiber, and the like may be used as nanostructures. Since the conduction layer 120 includes a pattern that corresponds to a network formed by intersecting nanostructures, a width of each portion respectively corresponding to the nanostructures of the conduction layer 120 may be extremely small so as to provide high light transmission. Therefore, the conduction layer 120 may have high light transmission and high conductivity by being formed with a highly conductive material and a pattern corresponding to a nanostructure network for high light transmission.

Figure 2:
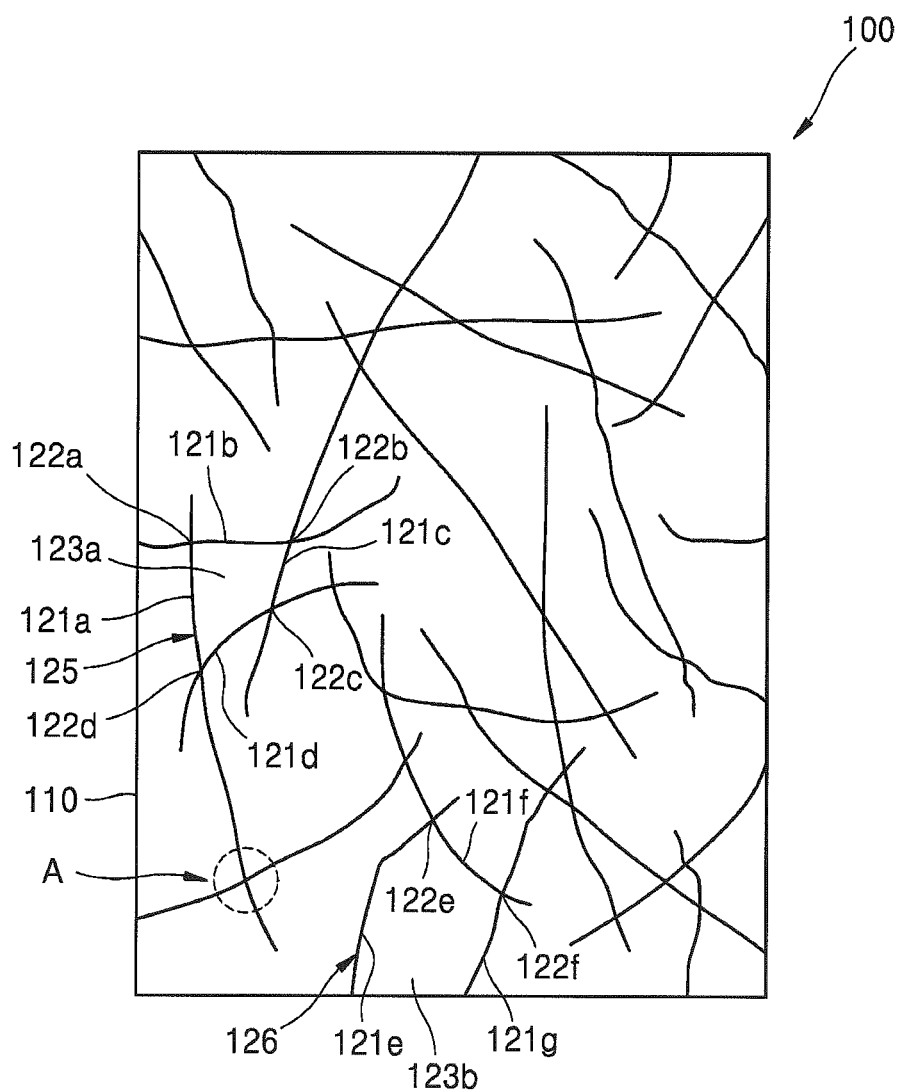
FIG. 2 is a plan view of a pattern of a conduction layer on a substrate in the light-transmitting conductor of FIG. 1.

The pattern corresponding to the nanostructure network does not directly refer to the network formed by intersecting nanostructures, but a pattern formed with respect to the network. As shown in the example of FIG. 2, such pattern includes a plurality of main portions 121, a plurality of intersections 122, and openings 123, The main portions 121 refer to portions corresponding to the nanostructures of the nanostructure network, the intersections 122 refer to intersections of the main portions 121, and the openings 123 refer to areas between the main portions 121. The main portions 121 and the intersections 122 allow the conduction layer 120 to have conductivity, and the openings 123 allow the conduction layer 120 to transmit light. Main portions 121a, 121b, 121c, and 121d and intersections 122a, 122b, 122c, and 122d may be connected with an opening 123a inside to form a closed system 125. Accordingly, the main portions 121 may be repeatedly connected to one another, thereby increasing electrical connection reliability in these portions, and thus effectively preventing electrical disconnection between the main portions 121 while manufacturing or using the light-transmitting conductor 100. Also, other main portions 121e, 121f, and 121g and other intersections 122e, 122f, and 122g may be connected without an evident distinction of inside and outside, and thus form an open system 126. The openings 123 may include a closed system opening 123a formed in the closed system 125, and an open system opening 123b formed in the open system 126. The closed system 125 and the open system 126 may be spaced apart and independently located, or adjacent to one another. Also, the open system 126 may be located inside the closed system 125, or vice versa. The main portion 121 may form an end 124. The end 124 of the main portion 121 may protrude toward the closed system opening 123a or the open system opening 123b.

Figure 3:
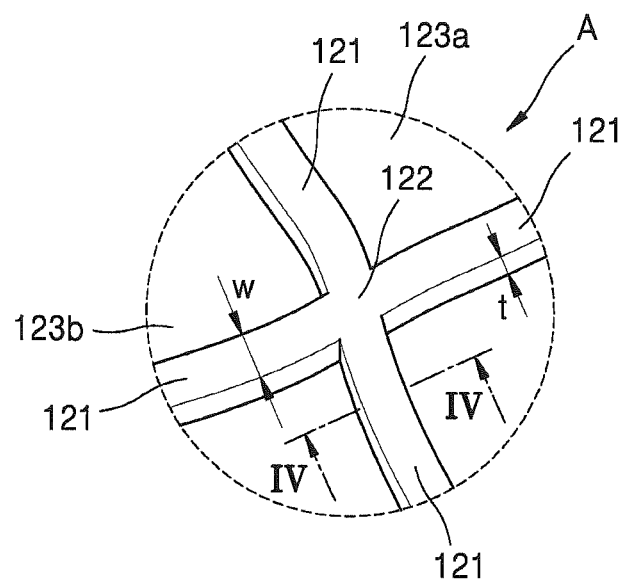
FIG. 3 is a partial plan view of a portion of the pattern of the conduction layer of FIG. 2.

As shown in the example of FIG. 3, a width w of the main portion 121 may vary depending on the network of nanostructures. For example, the width w of the main portion 121 may be within a range of 100 nm≤w≤2500 nm. Also, the width w of the main portion 121 may vary depending on a thickness t of the main portion 121. For example, when the thickness of the main portion 121 is t, the width w of the main portion 121 may be within a range of 100 nm≤w≤5t. Therefore, for example, when the thickness t of the main portion 121 is within a range of 0<t≤100 nm, the width w of the main portion 121 may be within a range of 100 nm≤w≤500 nm; when the thickness t of the main portion 121 is within a range of 100 nm<t≤300 nm, the width w of the main portion 121 may be within a range of 100 nm≤w≤1500 nm; and when the thickness t of the main portion 121 is within a range of 300 nm<t≤500 nm, the width w of the main portion 121 may be within a range of 100 nm≤w≤2500 nm. The intersection 122 may be substantially as thick as the main portion 121. Accordingly, a pattern of the conduction layer 120 may be formed as a single unit, and the intersection 122 and the main portion 121 may have substantially identical conductivity. When the intersection 122 is formed due to contact between the main portions 121, contact resistance may not cause touch sensitivity decrease.

The pattern of the conduction layer 120 may be amorphous. The amorphous pattern prevents stripes, i.e., moiré phenomenon, which occurs due to repetition of patterns. However, the conduction layer 120 is not limited to an amorphous pattern, and may include any type of patterns that correspond to a network formed by intersecting nanostructures.

Figure 4:
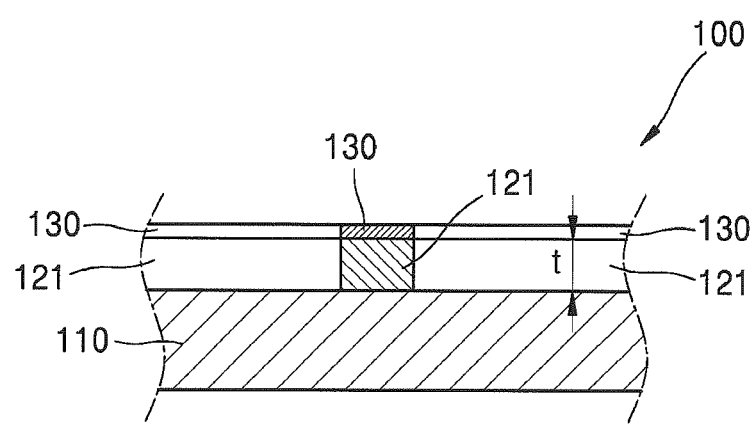
FIG. 4 is a cross-sectional view cut along the line IV-IV of FIG. 3.

As shown in the example of FIG. 4, a dark color layer 130 that has a dark color such as black may be formed on an upper portion of the conduction layer 120. When light transmits through the conduction layer 120 having the dark color layer 130 on its upper surface, the light is not blurry but clearly visible, thereby increasing visibility. When the conduction layer 120 is formed of metal, the dark color layer 130 may be formed easily by oxidizing the upper surface of the conduction layer 120. When the conduction layer 120 is fixated of a non-metal material, the dark color layer 130 may be faulted by adding a separate layer on the upper surface of the conduction layer 120.

Embodiment 2

Figure 5:
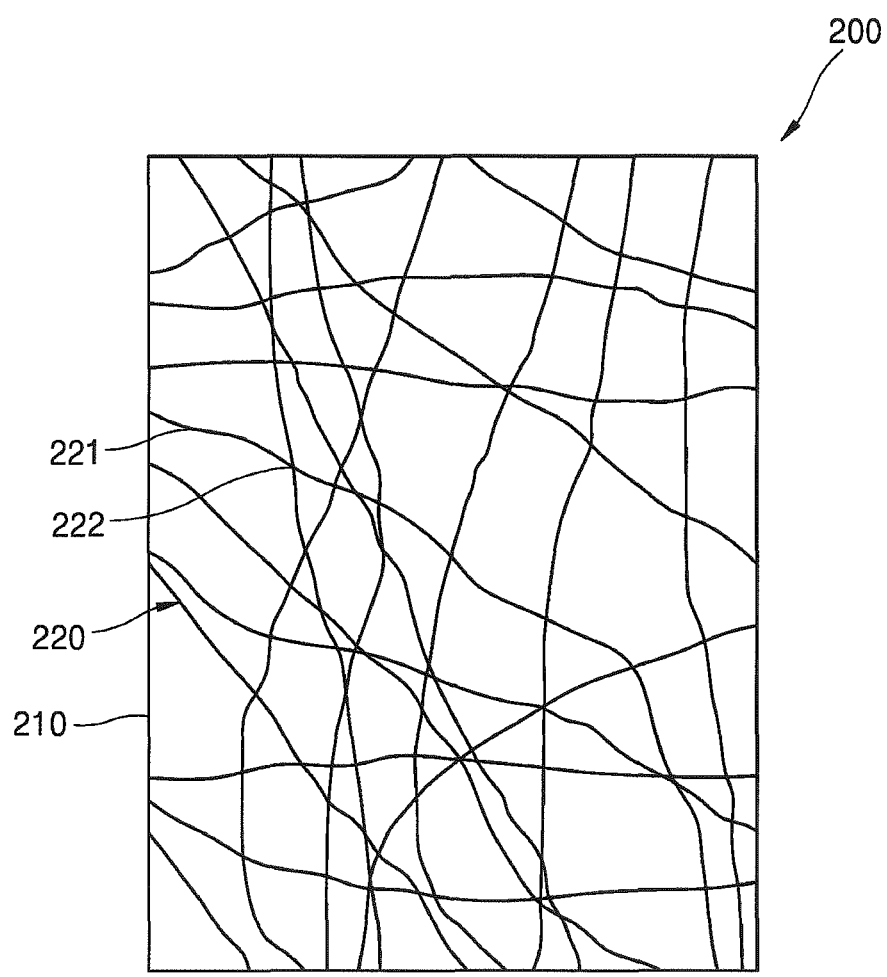
FIG. 5 is a plan view of a pattern of a conduction layer on a substrate in a light-transmitting conductor, according to an embodiment 2.

According to the present embodiment, as shown in the example of FIG. 5, a conduction layer 220 formed on a substrate 210 of a light-transmitting conductor 200 has a pattern that corresponds to a network formed by intersecting nanostructures. Thus, the conduction layer 220 includes a pattern that includes a main portion 221 and an intersection 222. However, since the main portion 221 consecutively extends from one end of the conduction layer 220 to another end of the conduction layer 220, an end of the main portion 221 does not exist in the pattern.

Accordingly, electrical connection reliability of the conduction layer 220 may be increased due to the main portion 221 and the intersection 222. Also, since there is no disconnected portions such as an end of the main portion 221, static electricity may be prevented from occurring at disconnected portions.

According to the present embodiment, the pattern of the conduction layer 220 may be easily formed by using nanofiber with a large aspect ratio as nanostructures.

Embodiment 3

Figure 6:
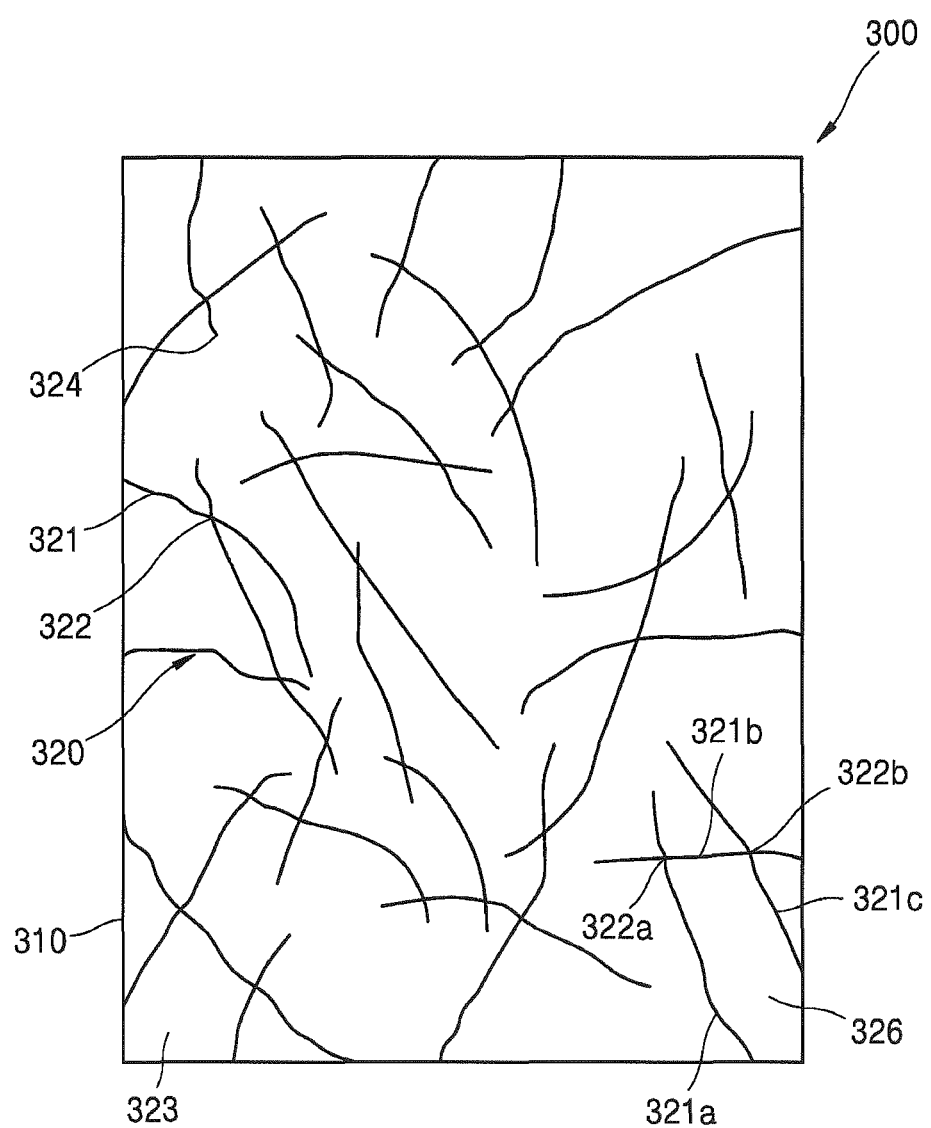
FIG. 6 is a plan view of a pattern of a conduction layer on a substrate in a light-transmitting conductor, according to an embodiment 3.

According to the present embodiment, as shown in the example of FIG. 6, a conduction layer 320 formed on a substrate 310 of a light-transmitting conductor 300 has a pattern that corresponds to a network formed by intersecting nanostructures. Thus, the conduction layer 320 includes a pattern that includes a main portion 321, an intersection 322, and an end 324 of a main portion 321. However, since the main portion 321 does not consecutively extend from one end of the conduction layer 320 to another end of the conduction layer 320, main portions 321a, 321b, and 321c and intersections 322a and 322b may be connected without an evident distinction of inside and outside and thus form an open system 326. However, the main portions 321a, 321b, and 321c and the intersections 322a and 322b cannot form a closed system in which the main portions 321a, 321b, and 321c and the intersections 322a and 322b are connected such that an opening 323 is therein.

Accordingly, it is possible to form a pattern which provides electrical connection reliability of the conduction layer may be increased by using a nanostructure without a large aspect ratio.

According to the present embodiment, the pattern of the conduction layer 320 may be easily formed by using nanotubes or nanowires that have a small aspect ratio than nano-fiber as nanostructures.

Embodiment 4

Figure 7:
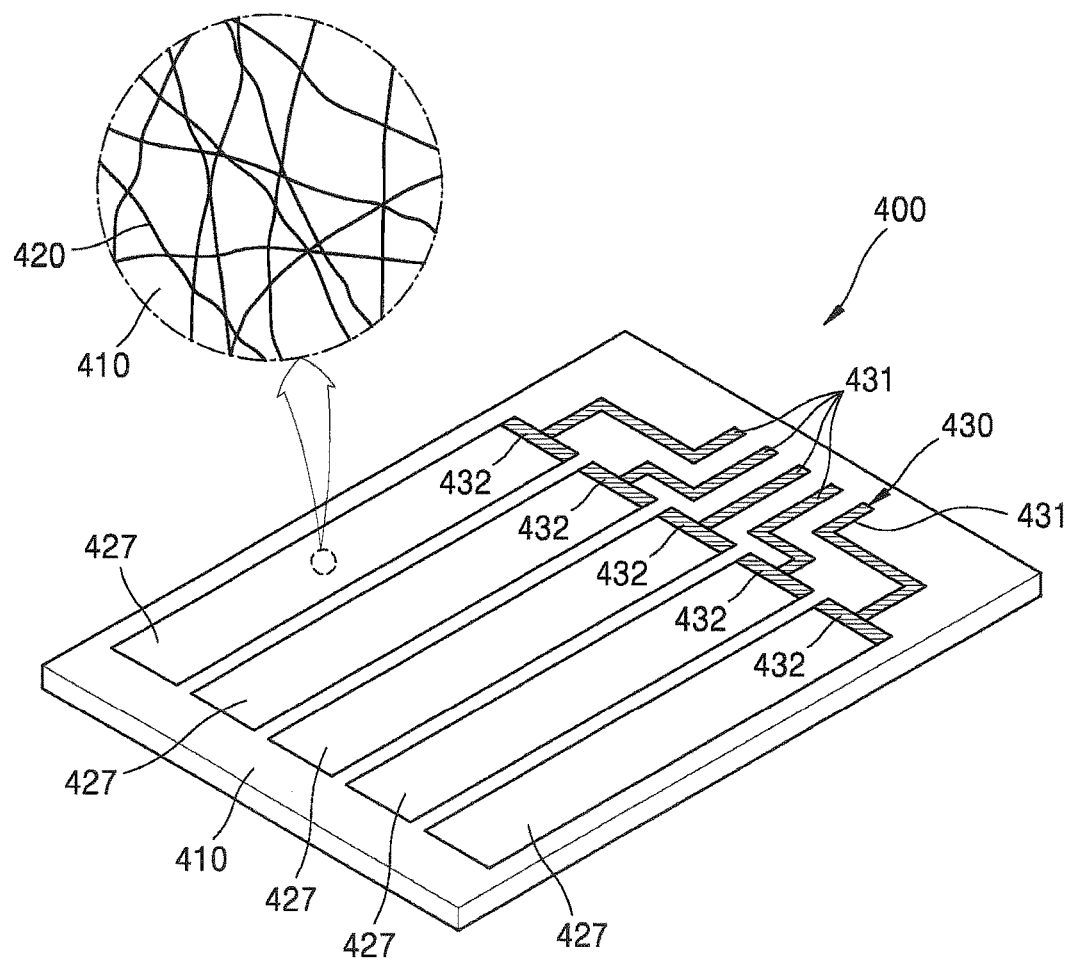
FIG. 7 is a perspective view of a terminal layer in a light-transmitting conductor, according to an embodiment 4.

According to the present embodiment, as shown in the example of FIG. 7, a terminal layer 430, which is electrically connected to a conduction layer 420, is provided on a substrate 410 that corresponds to an outer periphery of the conduction layer 420 of a light-transmitting conductor 400.

The light-transmitting conductor 400 may be connected through an external circuit (not shown) and the terminal layer 430, and thus may function as a portion of a system such as a touch screen panel.

The terminal layer 430 may be formed with the same material as the conduction layer 420, and thus electric interaction, such as a user's touch, on the conduction layer 420 may be efficiently transmitted to the terminal layer 430.

The conduction layer 420 includes a plurality of sensors 427 that detect external touch and send electric signals. The sensors 427 are spaced apart by certain distances. The terminal layer 430 includes a plurality of terminals 431 and connectors 432 that are connected to each of the sensors 427 of the conduction layer 420. Electric signals detected by the sensors 427 may pass through the connectors 432 and the terminals 431 of the terminal layer 430 and be transmitted to an external circuit.

The terminal layer 430 and the conduction layer 420 may have substantially the same thickness. Accordingly, the terminal layer 430 and the conduction layer 420 may be formed together, thereby simplifying the manufacturing process.

Embodiment 5

According to the present embodiment, the examples of FIGS. 8 to 15 show a method of manufacturing a light-transmitting conductor.

Figure 8:
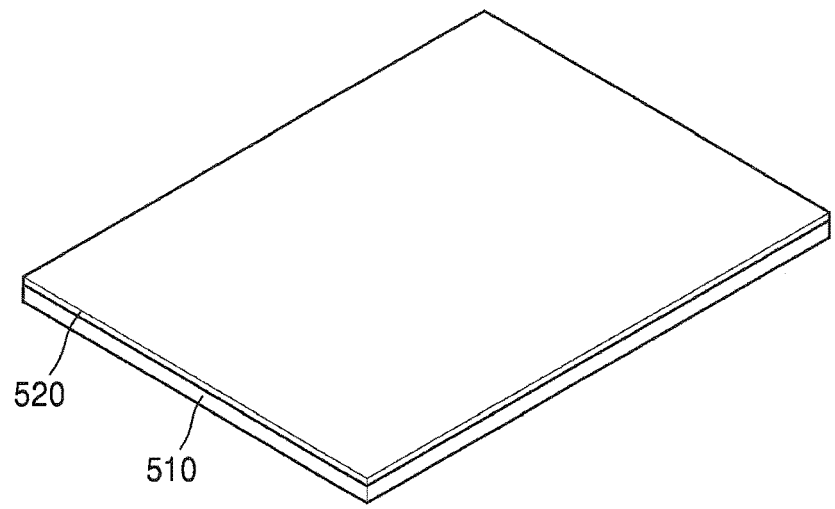
FIGS. 8 to 15 are views for describing a method of manufacturing a light-transmitting conductor, according to an embodiment 5.
Figure 9:
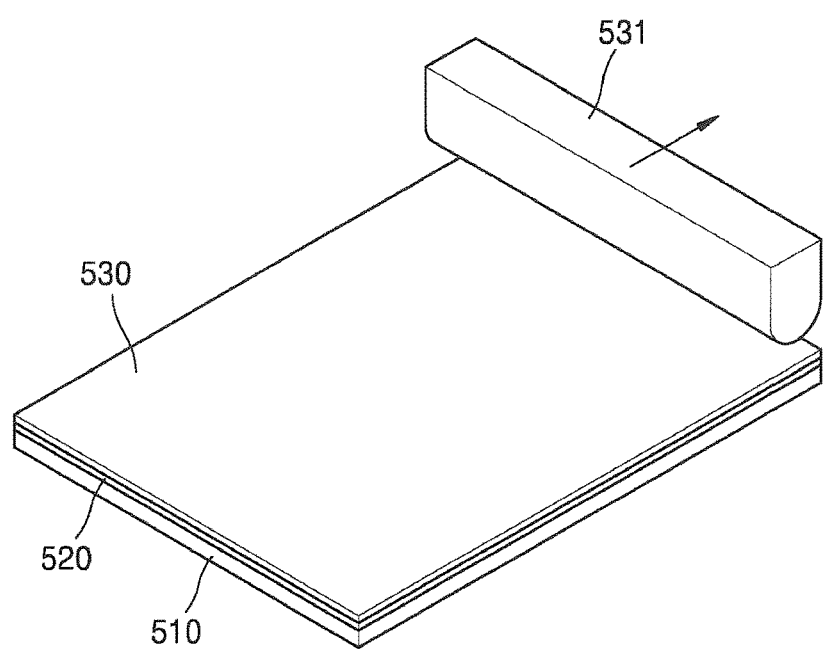
Figure 10:
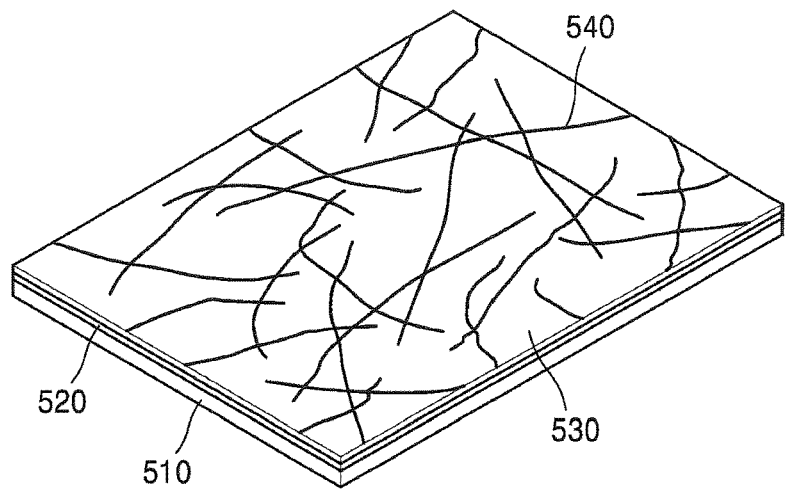
Figure 11:
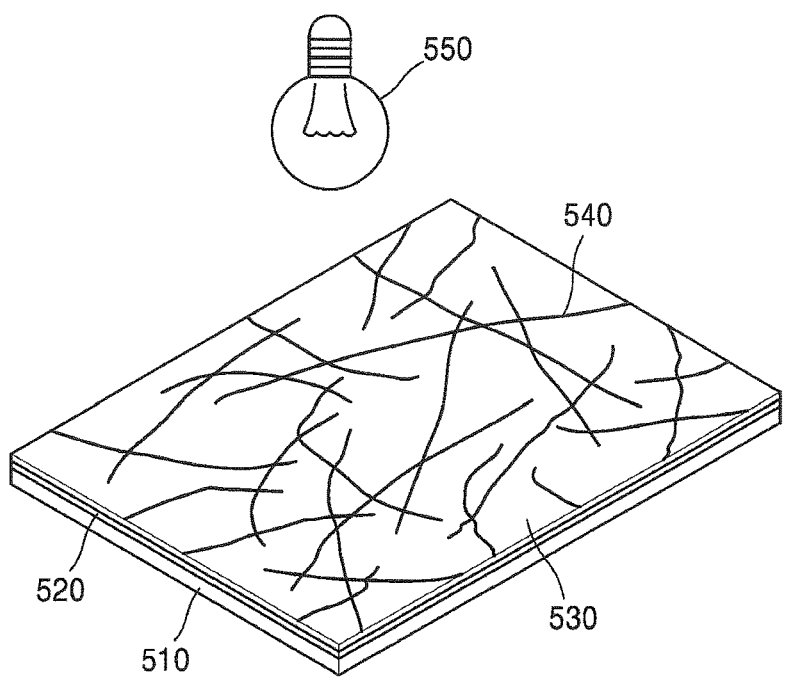
Figure 12:
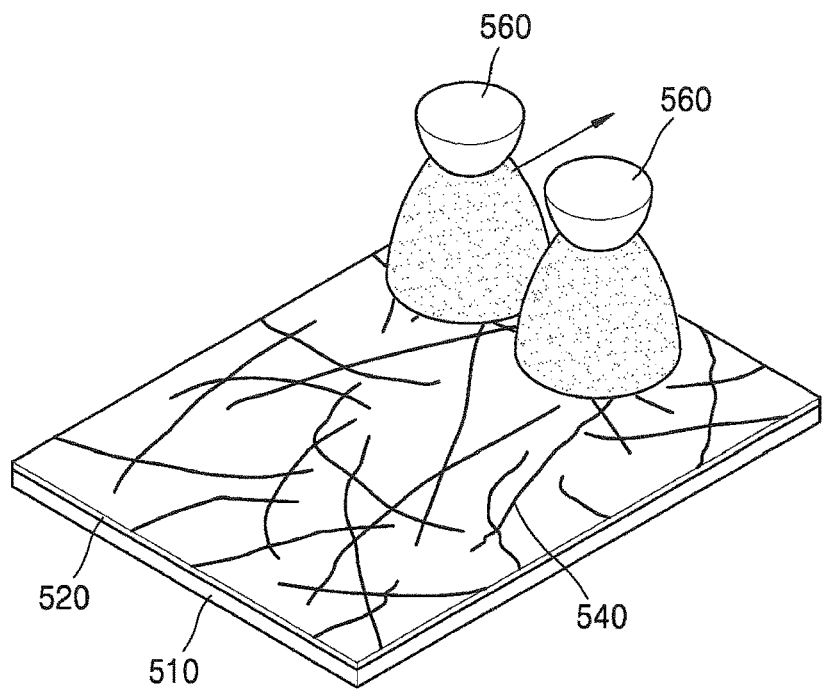
Figure 13:
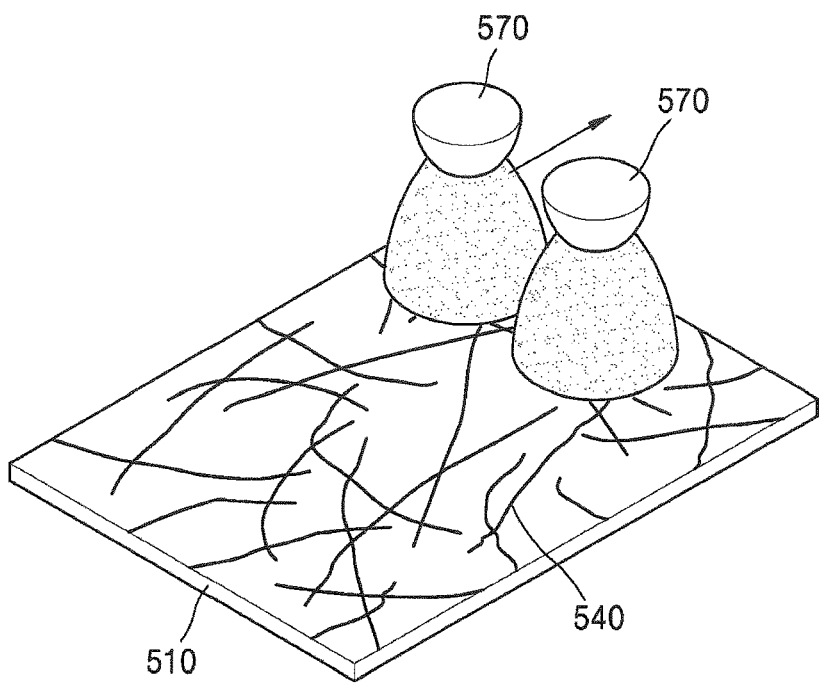
Figure 14:
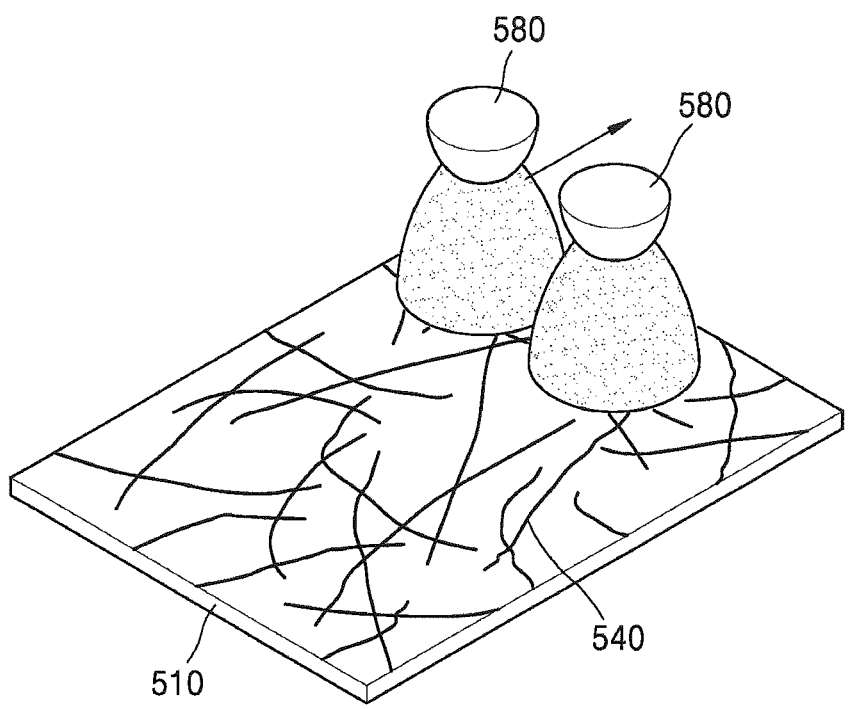
Figure 15:
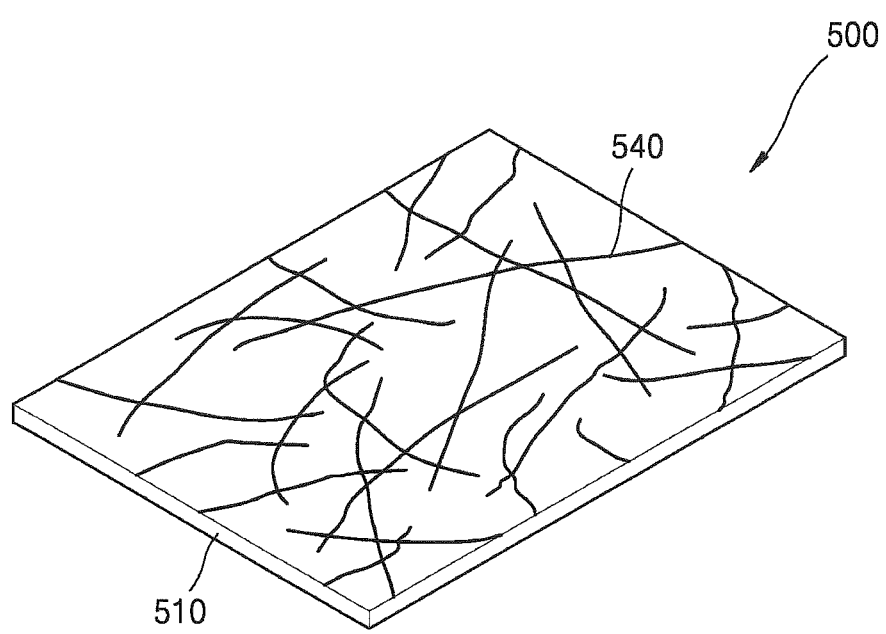

In the method of manufacturing the light-transmitting conductor according to the present embodiment, first, a conductive material 520 is coated on a substrate 510 (FIG. 8). In this case, a conductive material 520 may include a conductive metal such as gold, silver, or copper, or a conductive non-metallic material. The conductive material 520 may be coated on the substrate 510 by using various methods such as spin coating, plating, or the like. Next, a photosensitive material 530 is coated on the conductive material 520 (FIG. 9). The photosensitive material 530 may include various photosensitive materials such as photosensitive polymer. The photosensitive material 530 may be coated on the conductive material 520 by, for example, using a coating device 531 and printing a photosensitive material paste on the conductive material 520. After the photosensitive material 530 is coated, nanostructures are intersected and arranged to form a network 540 (FIG. 10). The nanostructure may include nanotubes, nanowires, nano-fiber, or a combination thereof. Next, a shape corresponding to the nanostructure network 540 is formed on the photosensitive material 530 (FIG. 11). The shape corresponding to the nanostructure network 540 may be formed on the photosensitive material 530 by emitting light from a light source 550 on the photosensitive material 530 through the nanostructure network 540. Thereafter, a developer is emitted by using a device such as a nozzle 560, and the photosensitive material 530 is developed to form a shape corresponding to a nanostructure network 540 (FIG. 12). The conductive material 520 is etched to a pattern corresponding to the nanostructure network 540 by using a nozzle 570 or another device to spray an etchant on an upper portion of the photosensitive material 530 that is developed to a shape corresponding to the nanostructure network 540 (FIG. 13). It is preferable that the pattern is shapeless but corresponds to the nanostructure network 540. Next, a conduction layer 550 is formed by using a device such as a nozzle 580 to peel the photosensitive material 530 that remains on an upper surface of the conductive material 520 that has a pattern corresponding to the nanostructure network 540 (FIG. 14). According to this process, a light-transmitting conductor is 500 complete.

In addition, a terminal layer (not shown) electrically connected to the conduction layer 550 is formed on the substrate 510 corresponding to an outer periphery of the conduction layer 550. The forming of the terminal layer includes coating a conductive material on the substrate 510; coating a photosensitive material on the conductive material; arranging a mask having a shape corresponding to the terminal layer on the photosensitive material and exposing light thereon to form a shape corresponding to a shape of the mask on the photosensitive material; and forming a pattern of the terminal layer on the conductive material according to the shape of the photosensitive material.

Embodiment 6

Figure 16:
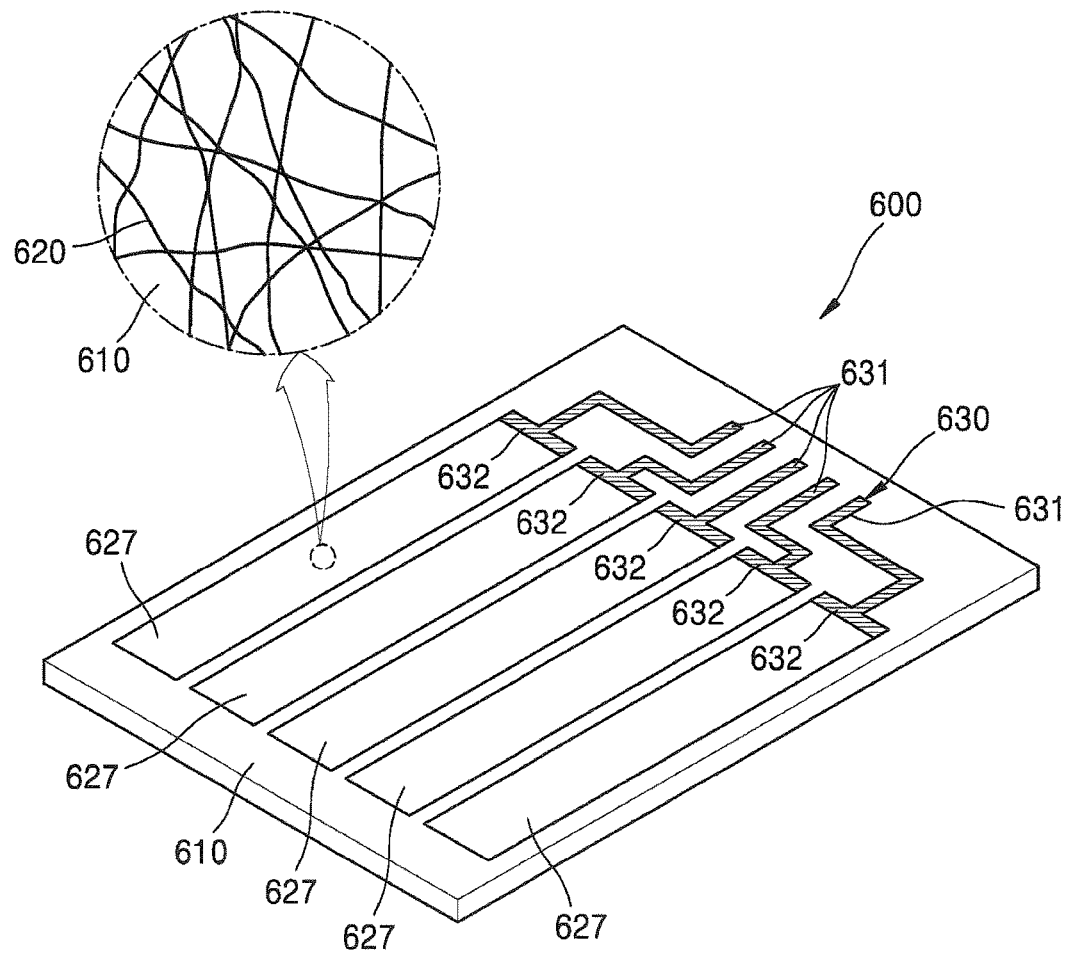
FIG. 16 is a view for describing a method of manufacturing a light-transmitting conductor, according to an embodiment 6.

According to the present embodiment, as shown in the example of FIG. 16, another method of manufacturing a light-transmitting conductor is shown. The method of manufacturing a light-transmitting conductor 600 according to the present embodiment includes forming a conduction layer 620 and a terminal layer 630 on a single coated conductive material. For this, first, the conductive material is coated on a substrate 610. In this case, the conductive material is formed to include both an area in which the conduction layer 620 is formed and an area in which the terminal layer 630 is formed. Next, the terminal layer 630 is patterned on the conductive material before coating a photosensitive material. The terminal layer 630 is formed on an area of the conductive material where the conduction layer 620 is not formed. The terminal layer 630 may be formed by, but is not limited to, photolithography. The terminal layer 630 is formed to include a terminal 631, and furthermore, it is preferable to include a connector 632 such that electricity flows smoothly through the conduction layer 620. After the terminal layer 630 is formed, the photosensitive material is coated on the conductive material such that a patterned area of the terminal layer 630. Then, nanostructures are arranged to intersect one another to thus form a network on a portion of the photosensitive material end of the conduction layer 320 to another end of the conduction layer 320, main portions 321a, 321b, and 321c and intersections 322a and 322b may be connected without an evident distinction of inside and outside and thus form an open system 326. However, the main portions 321a, 321b, and 321c and the intersections 322a and 322b cannot form a closed system in which the main portions 321a, 321b, and 321c and the intersections 322a and 322b are connected such that an opening 323 is therein.

Accordingly, it is possible to form a pattern which provides electrical connection reliability of the conduction layer may be increased by using a nanostructure without a large aspect ratio.

According to the present embodiment, the pattern of the conduction layer 320 may be easily formed by using nanotubes or nanowires that have a small aspect ratio than nano-fiber as nanostructures.

Embodiment 4

According to the present embodiment, as shown in the example of FIG. 7, a terminal layer 430, which is electrically connected to a conduction layer 420, is provided on a substrate 410 that corresponds to an outer periphery of the conduction layer 420 of a light-transmitting conductor 400.

The light-transmitting conductor 400 may be connected through an external circuit (not shown) and the terminal layer 430, and thus may function as a portion of a system such as a touch screen panel.

The terminal layer 430 may be formed with the same material as the conduction layer 420, and thus electric interaction, such as a user's touch, on the conduction layer 420 may be efficiently transmitted to the terminal layer 430.

The conduction layer 420 includes a plurality of sensors 427 that detect external touch and send electric signals. The sensors 427 are spaced apart by certain distances. The terminal layer 430 includes a plurality of terminals 431 and connectors 432 that are connected to each of the sensors 427 of the conduction layer 420. Electric signals detected by the sensors 427 may pass through the connectors 432 and the terminals 431 of the terminal layer 430 and be transmitted to an external circuit.

The terminal layer 430 and the conduction layer 420 may have substantially the same thickness. Accordingly, the terminal layer 430 and the conduction layer 420 may be formed together, thereby simplifying the manufacturing process.

Embodiment 5

According to the present embodiment, the examples of FIGS. 8 to 15 show a method of manufacturing a light-transmitting conductor.

In the method of manufacturing the light-transmitting conductor according to the present embodiment, first, a conductive material 520 is coated on a substrate 510 (FIG. 8). In this case, a conductive material 520 may include a conductive metal such as gold, silver, or copper, or a conductive non-metallic material. The conductive material 520 may be coated on the substrate 510 by using various methods such as spin coating, plating, or the like. Next, a photosensitive material 530 is coated on the conductive material 520 (FIG. 9). The photosensitive material 530 may include various photosensitive materials such as photosensitive polymer. The photosensitive material 530 may be coated on the conductive material 520 by, for example, using a coating device 531 and printing a photosensitive material paste on the conductive material 520. After the photosensitive material 530 is coated, nanostructures are intersected and arranged to form a network 540 (FIG. 10). The nanostructure may include nanotubes, nanowires, nano-fiber, or a combination thereof. Next, a shape corresponding to the nanostructure network 540 is formed on the photosensitive material 530 (FIG. 11). The shape corresponding to the nanostructure network 540 may be formed on the photosensitive material 530 by emitting light from a light source 550 on the photosensitive material 530 through the nanostructure network 540. Thereafter, a developer is emitted by using a device such as a nozzle 560, and the photosensitive material 530 is developed to form a shape corresponding to a nanostructure network 540 (FIG. 12). The conductive material 520 is etched to a pattern corresponding to the nanostructure network 540 by using a nozzle 570 or another device to spray an etchant on an upper portion of the photosensitive material 530 that is developed to a shape corresponding to the nanostructure network 540 (FIG. 13). It is preferable that the pattern is shapeless but corresponds to the nanostructure network 540. Next, a conduction layer 550 is formed by using a device such as a nozzle 580 to peel the photosensitive material 530 that remains on an upper surface of the conductive material 520 that has a pattern corresponding to the nanostructure network 540 (FIG. 14). According to this process, a light-transmitting conductor is 500 complete.

In addition, a terminal layer (not shown) electrically connected to the conduction layer 550 is formed on the substrate 510 corresponding to an outer periphery of the conduction layer 550. The forming of the terminal layer includes coating a conductive material on the substrate 510; coating a photosensitive material on the conductive material; arranging a mask having a shape corresponding to the terminal layer on the photosensitive material and exposing light thereon to form a shape corresponding to a shape of the mask on the photosensitive material; and forming a pattern of the terminal layer on the conductive material according to the shape of the photosensitive material.

(Em excluding a portion corresponding to the terminal layer 630. To do so, devices such as the shadow mask is used to coat the nanostructures on the photosensitive material. The shadow mask has closed portions with respect to the terminal layer 630 and open portions with respect to the conduction layer 620. Next, the nanostructure network is used to shape the photosensitive material corresponding to the nanostructure network by using light exposure and developing. Thereafter, according to the shape of the photosensitive material, a pattern is formed on the conductive material expect for the terminal layer 630 to form the conduction layer 620 that is connected to the terminal layer 630.

Accordingly, when manufacturing the light-transmitting conductor 600, the manufacturing process may be simplified and less material may be used by forming the conduction layer 620 and the terminal layer 630 on a single conductive material and forming sensors 627 of the conduction layer 620 and terminals 631 of the terminal layer 630 together. Also, display size may be reduced by reducing an area of the substrate in which the terminal layer 630 is formed.

Embodiment 7

According to the present embodiment, as shown in the example of FIG. 17, another method of manufacturing a light-transmitting conductor is shown. The method of manufacturing a light-transmitting conductor according to the present embodiment includes forming a light-transmitting conductor by using a first roller 791 and a second roller 792 with a consecutive processing method.

As a substrate 710 coated with a conductive material 720 rolled on the first roller 791 loosens because of a second roller 792, a coater 731 installed nearby the first roller 791 consecutively coats a photosensitive material 730 on the conductive material 720. Then, a spray 741 is installed after the coater 731 of the photosensitive material 730. The spray 741 is used to a network 740 is formed by intersecting nanostructures on the photosensitive material 730. Next, a light exposing device 750, a developing device 750, an etching device 770, and a peeling device 780 are sequentially installed. Each device is used to expose light on the photosensitive material 730 and develop the photosensitive material 730, etch the conductive material 720, and peel remaining photosensitive material 730. Through this process, a pattern of a conduction layer 790 or a pattern of the conduction layer 790 and a terminal layer (not shown) are formed on the substrate 710. Accordingly, the light-transmitting conductor 700 is manufactured and then, the light-transmitting conductor 700 is rolled by the second roller 792.

Since the light-transmitting conductor may be consecutively manufactured, the manufacturing process is simplified and quickly finished.

While one or more embodiments have been described with reference to the figures, it will be understood by those of ordinary skill in the art that various changes in form and details may be made therein without departing from the spirit and scope as defined by the following claims.

REFERENCE NUMERALS

100, 200, 300, 400, 500, 600, 700: Light-transmitting Conductor
110, 210, 310, 410, 510, 610, 710: Substrate
120, 220, 320, 420, 540, 620: Conduction layer
121, 221, 321: Main Portion
122, 222, 322: Intersection
123, 323: Opening
124, 324: End
130: Dark Color Layer
427, 627: Sensor
430, 630: Terminal Layer
431, 631: Terminal
520, 720: Conductive Material
530, 730: Photosensitive Material
791: First Roller
792: Second Roller

INDUSTRIAL APPLICABILITY

The present invention may be applied in fields that require a light-transmitting conductor and a method of manufacturing the same.

What is claimed is:

1. A light-transmitting conductor comprising:
a substrate; and
a conduction layer on the substrate,
wherein the conduction layer comprises a conductive material,
wherein the conduction layer comprises a pattern corresponding to a network formed by intersecting nanostructures, and
wherein the nanostructures are one selected from a group consisting of nanotube, nanowire, nanofiber, and a combination thereof.

2. The light-transmitting conductor of claim 1, wherein a thickness of the conduction layer is substantially constant.

3. The light-transmitting conductor of claim 1, wherein the conduction layer is integrally formed.

4. The light-transmitting conductor of claim 1, wherein the conductive material comprises metal.

5. The light-transmitting conductor of claim 1, wherein the conductive material comprises a conductive non-metal.

6. The light-transmitting conductor of claim 1, wherein the nanostructure is one selected from a group consisting of nanotube, nanowire, nano-fiber, and a combination thereof.

7. The light-transmitting conductor of claim 1, wherein the pattern comprises:
a plurality of main portions corresponding to the nanostructures of the network;
a plurality of intersections formed by intersecting the main portions; and
an opening between the main portions.

8. The light-transmitting conductor of claim 7, wherein the main portions and the intersections are connected with the opening inside to form at least one closed system.

9. The light-transmitting conductor of claim 7, wherein the main portions and the intersections are connected without an evident distinction of inside and outside to form at least one open system.

10. The light-transmitting conductor of claim 7, wherein the opening has a protruding end of the main portion.

11. The light-transmitting conductor of claim 7, wherein when a thickness of the main portion is t, a width w of the main portion is within a range of 100 nm≤w≤5t.

12. The light-transmitting conductor of claim 11, wherein a thickness t of the main portion is within a range of 0<t≤500 nm.

13. The light-transmitting conductor of claim 7, wherein the intersection has substantially the same thickness as the main portion.

14. The light-transmitting conductor of claim 1, wherein the pattern is amorphous.

15. The light-transmitting conductor of claim 1, wherein a terminal layer that is electrically connected to the conduction layer is provided on the substrate corresponding to an outer periphery of the conduction layer.

16. The light-transmitting conductor of claim 15, wherein the terminal layer is formed with the same material as the conduction layer.

17. The light-transmitting conductor of claim 15, wherein the terminal layer has substantially the same thickness as the conduction layer.

18. A method of manufacturing a light-transmitting conductor, the method comprising:
(1) coating a conductive material on a substrate;
(2) coating a photosensitive material on a conductive material;
(3) intersecting nanostructures on the photosensitive material to form a network of nanostructures;
(4) shaping the photosensitive material according to the network of nanostructures on by using the network of nanostructures; and
(5) forming a conduction layer by forming a pattern on the conductive material according to the shape of the photosensitive material.

19. The method of claim 18, wherein the conductive material of step (1) comprises metal.

20. The method of claim 18, wherein the photosensitive material of step (2) is photosensitive polymer.

21. The method of claim 18, wherein the nanostructure of step (3) is one selected from a group consisting of nanotube, nanowire, nano-fiber, and a combination thereof.

22. The method of claim 18, wherein step (4) comprises shaping the photosensitive material according to the network of nanostructures by exposing light on the photosensitive material through the network of nanostructures.

23. The method of claim 18, wherein the pattern of step (5) is amorphous.

24. The method of claim 18, further comprising forming a terminal layer that is electrically connected with the conduction layer, on the substrate corresponding to an outer periphery of the conduction layer.

25. The method of claim 24, wherein the forming of the terminal layer comprises:
   coating the conductive material on the substrate;
   coating the photosensitive material on the conductive material;
   shaping the photosensitive material according to a shape of the mask by arranging a mask shaped with respect to the terminal layer on the photosensitive material and exposing light; and
   forming a pattern of the terminal layer on the conductive material according to the shape of the photosensitive material.

26. A method of manufacturing a light-transmitting conductor, the method comprising:
   (1) coating a conductive material on a substrate;
   (2) patterning a terminal layer on the conductive material;
   (3) coating a photosensitive material on the conductive material such that a patterned portion of the terminal layer is included;
   (4) intersecting nanostructures on the photosensitive material except for a portion corresponding to the terminal layer, to form a network of nanostructures;
   (5) shaping the photosensitive material according to the network of nanostructures by using the network of nanostructures; and
   (6) forming a conduction layer connected to the terminal layer by forming a pattern of the conductive material except for the terminal layer according to the shape of the photosensitive material.

27. The method of claim 26, wherein the conductive material of step (1) includes an area where the conduction layer is formed and an area where the terminal layer is formed.

28. The method of claim 26, wherein the terminal layer of step (2) is patterned by photolithography.

* * * * *